(12) United States Patent
Ivanov et al.

(10) Patent No.: US 9,866,270 B2
(45) Date of Patent: *Jan. 9, 2018

(54) COAXIAL DATA COMMUNICATION WITH REDUCED EMI

(71) Applicant: Microchip Technology Incorporated, Chandler, AZ (US)

(72) Inventors: Galin Ivanov, Stutensee (DE); Maarten Kuijk, Antwerp (BE)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/295,730

(22) Filed: Oct. 17, 2016

(65) Prior Publication Data

US 2017/0041044 A1    Feb. 9, 2017

Related U.S. Application Data

(63) Continuation-in-part of application No. 14/701,114, filed on Apr. 30, 2015, now Pat. No. 9,473,205.

(Continued)

(51) Int. Cl.
| | |
|---|---|
| *H04B 15/00* | (2006.01) |
| *H04B 3/28* | (2006.01) |
| *H03H 1/02* | (2006.01) |
| *H03H 7/00* | (2006.01) |
| *H04B 3/50* | (2006.01) |

(Continued)

(52) U.S. Cl.
CPC .................. *H04B 3/28* (2013.01); *H03H 1/02* (2013.01); *H03H 7/004* (2013.01); *H04B 1/0475* (2013.01); *H04B 1/12* (2013.01); *H04B 3/26* (2013.01); *H04B 3/30* (2013.01); *H04B 3/50* (2013.01); *H01P 1/26* (2013.01)

(58) Field of Classification Search
CPC .......... H04B 3/28; H04B 1/0475; H04B 1/12; H04B 3/30; H04B 3/50; H01P 1/268; H01P 5/085; H01P 3/06; H03H 7/004; H03H 1/02

See application file for complete search history.

(56) References Cited

U.S. PATENT DOCUMENTS

| | | | |
|---|---|---|---|
| 5,243,623 A | 9/1993 | Murdock | ........................ 375/220 |
| 7,385,466 B2 | 6/2008 | Suenaga et al. | ............... 333/181 |

(Continued)

FOREIGN PATENT DOCUMENTS

| | | | | |
|---|---|---|---|---|
| EP | 2660990 A1 | 11/2013 | ............... | H04B 3/54 |

OTHER PUBLICATIONS

"Non Final Rejection" dated Feb. 26, 2016, relating to U.S. Appl. No. 14/701,114, p. 2-13.*

(Continued)

*Primary Examiner* — Daniel Washburn
*Assistant Examiner* — Amneet Singh
(74) *Attorney, Agent, or Firm* — Slayden Grubert Beard PLLC

(57) ABSTRACT

Data communication having improved electromagnetic interference (EMI) rejection when communicating through a coaxial cable is provided by using differential transmission and/or reception through a common-mode choke and a dissipative element resulting in extremely low radiated emissions and high immunity to external radiation interference in a low-cost way.

24 Claims, 6 Drawing Sheets

Related U.S. Application Data

(60) Provisional application No. 61/987,151, filed on May 1, 2014.

(51) Int. Cl.
  *H04B 1/04* (2006.01)
  *H04B 1/12* (2006.01)
  *H04B 3/30* (2006.01)
  *H04B 3/26* (2006.01)
  *H01P 1/26* (2006.01)

(56) References Cited

U.S. PATENT DOCUMENTS

| | | | |
|---|---|---|---|
| 8,698,571 B2 | 4/2014 | Takahashi et al. | 333/12 |
| 9,130,650 B1 | 9/2015 | Acimovic | |
| 9,473,205 B2 | 10/2016 | Ivanov et al. | |
| 2002/0037054 A1 | 3/2002 | Schurig | 375/257 |
| 2007/0252659 A1 | 11/2007 | Suenaga et al. | 333/32 |
| 2010/0244898 A1 | 9/2010 | Van Den et al. | 326/62 |
| 2010/0246647 A1 | 9/2010 | Maillard et al. | 375/220 |
| 2013/0177099 A1 | 7/2013 | Pischl et al. | 375/285 |
| 2014/0218132 A1 | 8/2014 | Chen | 333/181 |
| 2015/0055020 A1* | 2/2015 | Yoshino | G06F 13/385 |
| | | | 348/706 |

OTHER PUBLICATIONS

Analog Device: Microstrip and Stripline Design, Rev. 0, Jan. 2009, URL: http://www.analog.com/media/training-seminars/tutorials/MT-094.pdf, 7 pages, © 2009.

Schneider, Matthew J., "Design Considerations to Reduce Conducted and Radiated EMI," College of Technology Masters Theses, Purdue University, 155 pages, Apr. 21, 2010.

International Search Report and Written Opinion, Application No. PCT/US2015/028834, 13 pages, dated Jul. 17, 2015.

European Office Action, Application No. 15724129.0, 4 pages, dated Aug. 29, 2017.

* cited by examiner

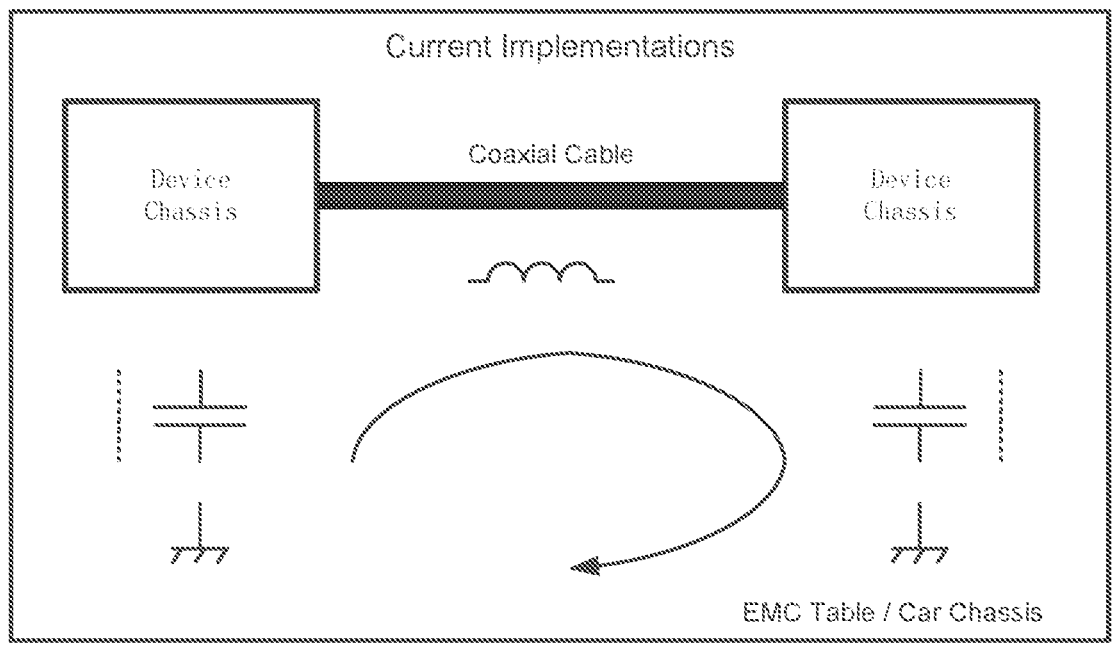
FIGURE 2 (prior technology)
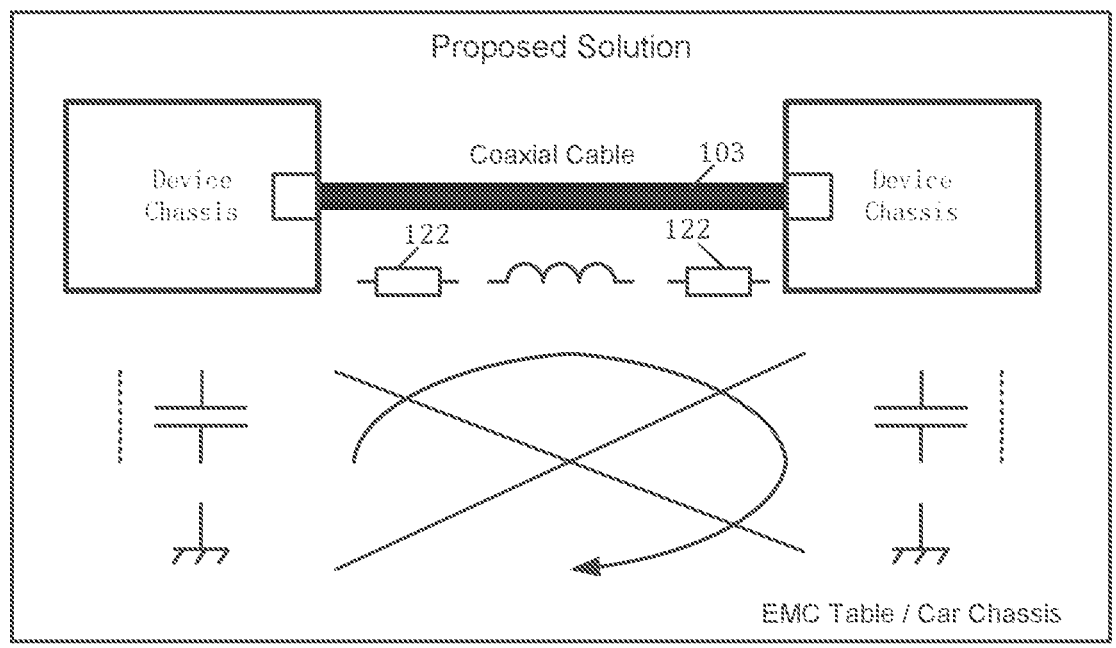
FIGURE 3

COAXIAL DATA COMMUNICATION WITH REDUCED EMI

RELATED PATENT APPLICATION

This application is a continuation in part of U.S. patent application Ser. No. 14/701,114; filed Apr. 30, 2015, which claims priority to commonly owned U.S. Provisional Patent Application No. 61/987,151; filed May 1, 2014; which are hereby incorporated by reference herein for all purposes.

TECHNICAL FIELD

The present invention relates to communication over coaxial cables, and, more particularly, to communication over coaxial cable with improved electromagnetic interference (EMI) properties.

BACKGROUND

Electronic technologies are pushing the demand for increased data transmission speed (bandwidth) over wired interconnection systems, e.g., coaxial cable. Current problems of using coaxial cable interconnections for data transmissions are for example but not limited to: ground loops causing noise pickup, coaxial cable lengths that are resonant at certain frequencies with subsequent unwanted antenna effects that increase unwanted signal (interference) reception and emission, poor shielding effectiveness to electromagnetic interference (EMI), poor common mode noise rejection, and the inability to use ferrite chokes in wiring harnesses, e.g., for automotive applications. These coaxial cable weaknesses may reduce the reliability of high speed data communications when the signal-to-noise ratio thereof is degraded by the coaxial cable being subjected to electromagnetic interference (EMI).

SUMMARY

Therefore a need exists for reduced electromagnetic interference (EMI) when communicating through a coaxial cable.

According to an embodiment, a transmission circuit using a coaxial cable having a center conductor and a shield may comprise: an integrated circuit may comprise a differential driver having first and second outputs; a common mode choke coupled between the first output of the differential driver and the center conductor of the coaxial cable, and between a first ground node and the shield of the coaxial cable; a terminating impedance coupled between the second output of the differential driver and the first ground node; and a dissipative element coupled between the shield of the coaxial cable and a second ground node.

According to a further embodiment, the integrated circuit may further comprise a differential receiver having first and second inputs that may be configured to be coupled with the first and second outputs of the differential driver, respectively. According to a further embodiment, a printed circuit board may be provided having a ground plane thereon, wherein the integrated circuit may be mounted on the printed circuit board. According to a further embodiment, first and second transmission lines may be provided on the printed circuit board, wherein the first transmission line may be coupled between the first output of the driver and the common mode choke, and the second transmission line may be coupled between the second output of the driver and the terminating impedance. According to a further embodiment, the first and second transmission lines and the ground plane may form a microstrip transmission circuit. According to a further embodiment, a second ground plane on an opposite side of the first and second transmission lines may be provided, wherein the first and second transmission lines, the ground plane and the second ground plane may form a stripline transmission circuit.

According to a further embodiment, a first DC-blocking capacitor may be coupled between the dissipative element and the second ground node. According to a further embodiment, second and third DC-blocking capacitors may be coupled between the first and second outputs of the differential driver and the common mode choke. According to a further embodiment, the dissipative element may comprise a dissipative resistor. According to a further embodiment, the dissipative resistor may be from about 3 ohms to about 100 ohms. According to a further embodiment, the dissipative resistor may be from about 20 ohms to about 45 ohms. According to a further embodiment, the dissipative resistor may be about 33 ohms.

According to a further embodiment, the dissipative element may comprise a dissipative inductance. According to a further embodiment, the dissipative inductance may be a ferrite bead. According to a further embodiment, the dissipative element may be a dissipative impedance that may comprise a dissipative resistor and inductor. According to a further embodiment, the first ground node may be connected to a digital ground plane. According to a further embodiment, the second ground node may be connected to a chassis ground. According to a further embodiment, the first and the second ground nodes may be coupled together.

According to another embodiment, a transmission circuit using two coaxial cables each having a center conductor and a shield may comprise: an integrated circuit that may comprise a differential driver having first and second outputs, and a differential receiver having first and second inputs; a first common mode choke coupled between the first output of the differential driver, and between a first ground node and the shield of one of the coaxial cables; a first terminating impedance coupled between the second output of the first differential driver and the first ground node; a first dissipative element coupled between the shield of the one end of the coaxial cable and a second ground node; a second common mode choke coupled between the first input of the differential receiver and the center conductor of the other coaxial cable, and between the second input of the differential receiver and the shield of the other coaxial cable; second terminating impedances coupled between the first and second inputs of the differential receiver and the first ground node; and a second dissipative element coupled between the shield of the other coaxial cable and the second ground node.

According to yet another embodiment, a system for transferring information over a coaxial cable having a center conductor and a shield may comprise: a data transmission device that may comprise: a first integrated circuit comprising a differential driver having first and second outputs, a first common mode choke coupled between the first output of the differential driver and the center conductor, and between a first ground node and the shield of one end of the coaxial cable, respectively; a first terminating impedance coupled between the second output of the differential driver and the first ground node; a first dissipative element coupled between the shield of the one end of the coaxial cable and a second ground node; and a data reception device that may comprise: a second integrated circuit comprising a differential receiver having first and second inputs, a second common mode choke coupled between the first and second inputs of the differential receiver and the center conductor and the shield of another end of the coaxial cable, respectively; second terminating impedances coupled between each differential input of the differential receiver and a third ground node, and a second dissipative element coupled between the shield of the another end of the coaxial cable and a fourth ground node.

According to a further embodiment, a radio frequency bypass capacitor may be coupled between the third ground node and the differential input of the differential receiver not coupled to the center conductor of the coaxial cable through the second common mode choke. According to a further embodiment, a first printed circuit board having a first ground plane thereon may be provided, wherein the first integrated circuit may be mounted on the first printed circuit board; and a second printed circuit board may be provided having a second ground plane thereon, wherein the second integrated circuit may be mounted on the second printed circuit board.

According to a further embodiment, first and second transmission lines on the first printed circuit board may be coupled between the first and second outputs, respectively, of the differential driver and the first common mode choke; and third and fourth transmission lines on the second printed circuit board may be coupled between the first and second inputs, respectively, of the differential receiver and the second common mode choke. According to a further embodiment, the first and second dissipative elements may comprise first and second dissipative resistors.

According to a further embodiment, first and second DC-blocking capacitors may be coupled in series with the first and second dissipative resistors and the first and second grounds, respectively. According to a further embodiment, third and fourth DC-blocking capacitors may be coupled between the first and second outputs of the differential driver and the first common mode choke; and fifth and sixth DC-blocking capacitors may be coupled between the first and second inputs of the differential receiver and the second common mode choke.

According to still another embodiment, a system for bi-directionally transferring information over a coaxial cable having a center conductor and a shield may comprise: a first data transmission device that may comprise: a first integrated circuit that may comprise a first differential driver having first and second outputs, and a first differential receiver having first and second inputs; a first common mode choke coupled between the first output of the first differential driver, the first input of the first differential receiver and the center conductor of one end of the coaxial cable, and between a first ground node and the shield of the one end of the coaxial cable; a first terminating impedance coupled between the second output of the first differential driver and the first ground node; a first dissipative element coupled between the shield of the one end of the coaxial cable and a second ground node; and a second data transmission device may comprise: a second integrated circuit that may comprise a second differential driver having first and second outputs, and a second differential receiver having first and second inputs; a second common mode choke coupled between the first output of the second differential driver, the first input of the second differential receiver and the center conductor of another end of the coaxial cable, and between a third ground node and the shield of the other end of the coaxial cable; a second terminating impedance coupled between the second output of the second differential driver and the third ground node; and a second dissipative element coupled between the shield of the other end of the coaxial cable and a fourth ground node.

BRIEF DESCRIPTION OF THE DRAWINGS

A more complete understanding of the present disclosure may be acquired by referring to the following description taken in conjunction with the accompanying drawings wherein:

FIG. 2 illustrates a schematic block diagram of a prior technology data communications system using coaxial cable;

FIG. 3 illustrates a schematic block diagram of a data communications system using the coaxial cable circuit shown in FIG. 1;

Figure 1:
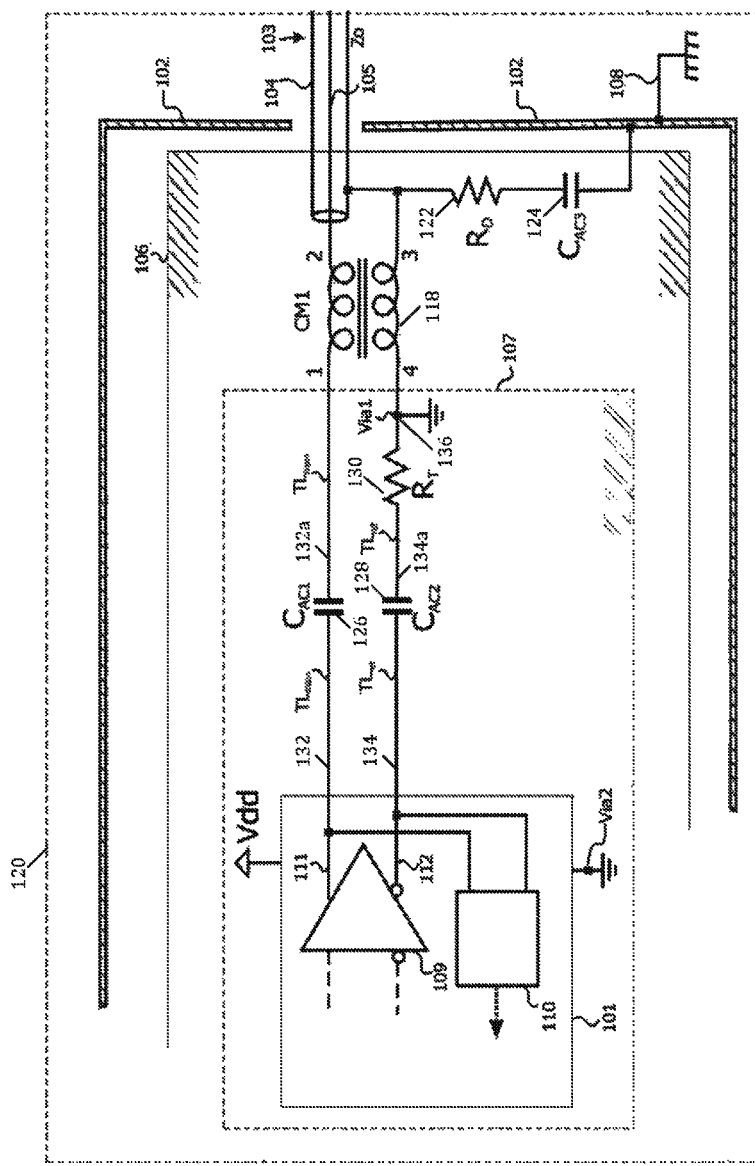
FIG. 1 illustrates a schematic diagram of a data communications circuit using coaxial cable and having reduced EMI, according to a specific embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

There exists a need for increasing data transmission speed (information bandwidth) with reduced electromagnetic interference (EMI) when communicating through a coaxial cable. Current problems of coaxial cable signal interconnections for example are but not limited to: grounding, ground loops, resonances/antenna-effects, shielding effectiveness (immunity and emissions), circuit topology imbalance→EMI, inability to use ferrite chokes in automotive wire-harnesses, etc. Generally, there also exists a need during high bit rate communications for reducing electromagnetic radiation emissions as well as providing immunity to external interference when using coaxial cable signal interconnections. Stringent automotive EMI requirements have to be met at low cost while providing high bit rate communications, even for full-duplex communications over a single coaxial cable.

To meet these difficult technical requirements the following must be achieved: 1) reduce outgoing electromagnetic radiation (emission) originating from outgoing (transmitted) data, 2) reduce electromagnetic radiation (emission) originating from digital circuitry on a printed circuit board (PCB) of an electronic device, e.g., noise generated from power/ground planes by device switching, etc.; 3) reduce electromagnetic radiation (emission) originating from stimulation of resonances, e.g., resonances that are due to high Q-factor coupling of two or more devices through the connecting coaxial cable; 4) transmitting and receiving both half-duplex and full-duplex over a coaxial cable at high bit rates, 5) achieve high immunity to incidental radiation (called bulk-current injection) as required for automotive applications, and 6) keep component and manufacturing costs low.

According to various embodiments, a minimal required circuit topology for communications using coaxial cable is provided by using a common-mode choke and a dissipative element having impedance, e.g., resistor, inductor, and combinations thereof, resulting in extremely low radiated emissions and high immunity to external radiation interference in a low-cost way.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic diagram of a data communications circuit using coaxial cable and having reduced EMI, according to a specific embodiment of this disclosure. An exemplary embodiment, according to the teachings of this disclosure, may comprise an integrated circuit (IC) 101 having circuits for performing data communications, e.g., networking functions. The IC 101 may include a differential driver 109 and, optionally, a differential receiver 110. The IC 101 may be arranged on a printed circuit board (PCB) 106 that may be contained inside of a chassis (e.g., enclosure) 102 of a device 120. The device 120 may be used for, but is not limited to, taking and/or recording pictures and/or sound, networking, display (man-machine interface—MMI), sensing, control, etc. The PCB 106 may also comprise a digital ground plane 107, a common mode choke 118, and a dissipative element 122.

In order to communicate with other devices, a coaxial cable 103 (e.g., a short coaxial cable) may be connected between the device 120 and another device(s) (not shown). The chassis 102 may not necessarily completely enclose the device 120, e.g., a display having an opening for viewing the display that may be part of the device 120. Chassis 102, preferably, may be made of a conductive material for preventing radiation or reception of EMI. Depending on the use of the device 120, the chassis 102 may have a chassis-ground connection (node) 108 that may be used to connect it to a vehicle's chassis frame (not shown). It is also contemplated and within the scope of this disclosure that the chassis ground 108 may be connected to the digital ground plane 107.

The coaxial cable 103 is intended for data communication, e.g., transmitting and/or receiving data either in simplex, half-duplex or in full duplex mode. In order to transmit signals, the differential driver 109 generates a complementary output signal at its output nodes 111 and 112. Preferably each of the outputs nodes 111 and 112 of the differential driver 109 may be coupled to an appropriate source termination (not shown). Preferably, the output signal on output nodes 111 and 112 are configured as differential (signals are in anti-phase) having substantially no common mode component. In practice however, there will always be a small common mode component present due to a small unbalance in the output driver circuitry, or a non-linearity generating a small level of duty-cycle-distortion. Output node 111 drives a transmission line 132 ($TL_{main}$) that is coupled from the IC 101 to the common-mode choke 118. The coaxial cable 103 may be closely coupled the common-mode choke 118. Output node 112 drives a transmission line 134 (TLref) also coupled to the common-mode choke 118. AC-coupling may be provided anywhere in one or both of the transmission lines 132 and/or 134. AC-coupling of both transmission lines 132 and 134 are preferable when transmitting DC-balanced signal data. It is contemplated and within the scope of this disclosure that one having ordinary skill in electronic circuit design and the benefit of this disclosure could place one or more DC blocking capacitors (AC coupling capacitors) at different places in the circuits disclosed herein to block DC voltages from appearing with AC signals.

AC signal coupling (DC blocking) may be provided by capacitors 124, 126 and/or 128. The reference transmission line 134 may be further terminated by a series terminating impedance (e.g., resistor) 130 that may be coupled to the digital ground plane 107. The transmission lines 132 and 134 may be referenced to the digital ground plane 107 through grounding node 136 (Via1). The digital ground plane 107 is preferably the ground plane present just below the transmission lines 132 and 134 in which the transmission line's return currents are present. Using the digital ground plane 107 and the transmission lines 132 and 134 together form microstrip transmission lines. Placing a second ground plane (not shown) on the other side of the transmission lines 132 and 134 forms stripline transmission lines. Using either microstrip or stripline transmission lines provides for lower EMI radiation and pickup, and a substantially constant transmission impedance.

The grounding node 136 may be further coupled to one of the inputs of the common-mode choke 118, shown in FIG. 1 as connection 4. The transmission line 132a may be coupled to the other input of the common-mode choke 118, shown in FIG. 1 as connection 1. Both transmission lines 132 and 134 are preferably constructed as much as possible in a symmetric way, e.g., substantially the same lengths and widths, and referenced to the same digital ground plane 107, e.g., same characteristic impedances, etc. At the beginning of both transmission lines 132 and 134, the IC 101 will preferably have a connection to the digital ground plane 107. This digital ground plane 107 connection is also preferable when a differential receiver 110 of the IC 101 is used to receive data signals coming from the coaxial cable 103.

The common-mode choke 118 will allow the differential current arriving at the end of both transmission lines 132 and 134 to pass substantially un-attenuated. For example, when the differential driver 109 transmits at each of its output nodes 111 and 112 single-ended 500 mV signals 180 degrees out of phase and referenced to the digital ground plane 107. A 1000 mV (1 volt) peak-to-peak differential signal will be produced. Whereas only a 500 mV signal will be launched into the coax 103 between its center conductor 105 and shield 104. The other half of this signal voltage will be terminated in the termination impedance (resistor) 130. By making the differential to single-ended signal conversion in this way adjacent to the common-mode choke 118, only very little common mode voltages will be presented to the common-mode choke, since both opposite signal currents are presented to the common-mode choke's inputs. Only the aforementioned non-ideal small component of common-mode signal generation due to duty-cycle distortion may be present at the common-mode choke 118, but that already small signal will be further reduced by the choking behavior of the common-mode choke 118 with respect to the common-mode signals. Also voltage bouncing present on the PCB 106, e.g., caused by transistor switching currents due to digital activity of the IC 101 and/or also other ICs (not shown), will be choked in an effective way by the common-mode choke 118.

At the other side of the common-mode choke 118, output connections 2 and 3 may be coupled to the center conductor 105 and shield 104, respectively, of the coaxial cable 103. The shield 104 may further be coupled to the chassis 102 through the dissipative element 122 that may be, for example but is not limited to, a resistor and/or an inductor (e.g., a ferrite bead). The dissipative element 122 may have a resistive part and an inductance part when looking at the complex impedance. Further, in most cases, it is preferable that there is no DC current between the shield 104 and the chassis 102, for which it is advised to provide a series connected DC blocking device in the path of the dissipative element 122 with an AC-coupling (DC blocking) capacitor 124.

The resistive value of the dissipative element 122 should be chosen with some consideration. There is a trade-off involved. A small value is good for reflecting incident bulk-current injection current that is generated on the shield 104 of the coaxial cable 103 when performing radiation immunity performance testing. A larger resistance value will tend to dissipate the bulk-current injected wave, will cause heating of the dissipative element 122 and will also allow more of the bulk-current to be injected into the device 102 instead of reflecting it. So a smaller value for the dissipative element 122 seems to be ideal, however, another function of the resistance value of the dissipative element 122 is to serve as a dissipating resistance in the otherwise high-Q factor system when two or more devices are coupled together with a coaxial cable 103 therebetween. When having a high Q-factor system, a multitude of resonance frequencies can be stimulated by the smallest input signal, e.g., coming from the PCB 106. Coupling with one of these signals or any of its harmonics originating from signals or radiation anywhere in the device chassis 102 may be enough to generate an unwanted radiated emission peak in the emission spectrum of the system incorporating the device 120. Thus the resistance and/or inductance of the dissipative element 122 when made sufficiently large enough will reduce resonances of this type. In practice a value of a few ohms up to about 100 ohms would work, more specifically good results have been observed for achieving good bulk current injection immunity as reducing radiation emissions with a resistance value in the range of from about 20 ohms to about 45 ohms. Preferably the resistance value may be about 33 ohms.

When the IC 101 is closely coupled to the common-mode choke 118, the transmission lines 132 and 134 can be reduced to very short lengths, and thereby become just electrical nodes of the data transmission circuit. In that case, all the rest of the preferred circuitry remains the same. Still the termination impedance 130 will remain as needed, with its connection to the ground node 136 and the common-mode choke 118 input connection 4. One of the advantages is, however, that the IC 101 doesn't necessarily need to be positioned close to the coax connection. In practical cases the coaxial cable 103 may be connected through a suitable coaxial connector, it is contemplated and within the scope of this disclosure that a person having ordinary skill in the electronic arts and having the benefit of this disclosure may implement such connections in a way that merits various embodiments thereof.

When only transmitting data from device 120 through the coaxial cable 103, the common mode voltage of the signals on nodes 111 and 112 will be quite small, since the two nodes are intended to have been provided as anti-phase signals by the driver 109. When also receiving a data signal from the coax 103, originating from a device at the other end of the coaxial cable 103, this will be seen as a reduced data signal superimposed in the common mode voltage of the signals on nodes 111 and 112. Therefore, receiver 110 can reject the common mode signals on nodes 111 and 112 for the purpose of receiving data originating from the other end of the coaxial cable 103. If IC 101 is intended as a receiver only, then the driver 109 can be reduced to its source terminating resistors (not shown), serving as transmission line terminations of transmission lines 132 and 134. The differential receiver 110 may remain the same in either case.

It is contemplated and within the scope of this disclosure that the differential receiver 110 may share the same circuit components as the driver 109, e.g., common-mode choke 118, dissipative element 122, coaxial cable 103, etc., or the differential receiver 110 circuit components may be independent of the driver 109 circuit components. This allows simultaneous full duplex operation, and/or simultaneous dual simplex operation with appropriately connected drivers, receivers and coaxial cables.

Figure 6:
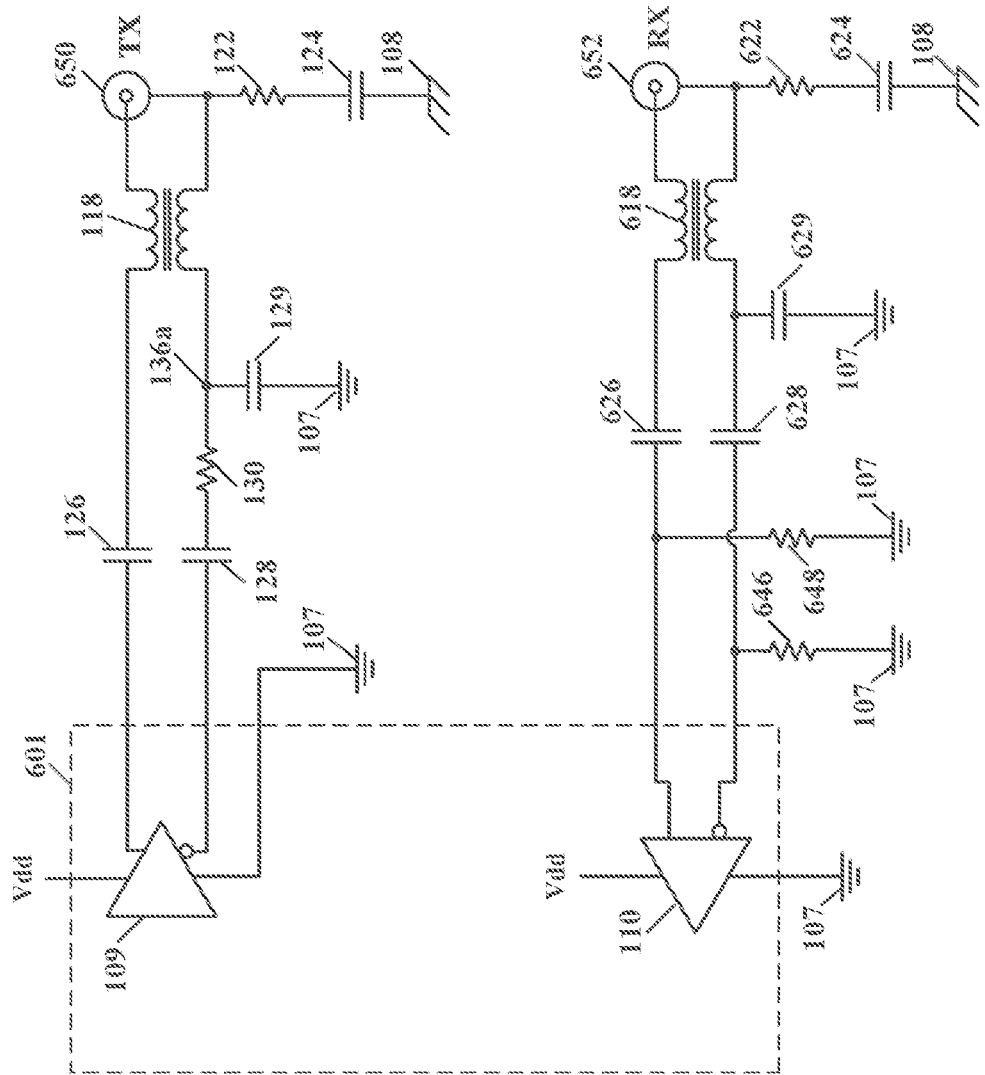
FIG. 6 illustrates a schematic diagram of a first data communications circuit using separate circuit components and coaxial cables for receive and transmit and having reduced EMI, according to another specific embodiment of this disclosure.

Referring to FIG. 6, depicted is a schematic diagram of a data communications circuit using separate circuit components and coaxial cables for receive and transmit and having reduced EMI, according to another specific embodiment of this disclosure. When using a separate coaxial cable, e.g., connected to coaxial connector 652 for receive functions the aforementioned transmit (driver 109) circuit components may be duplicated. A receive common-mode choke 618 may be coupled between the receive coaxial cable (connector 652) and the differential inputs of the differential receiver 110. A receive dissipative element 622 may be coupled between the shield side of the receive coaxial cable and chassis ground 108, and terminating impedances 646 and 648 may be coupled between the differential inputs of the receiver 110 and the digital ground plane 107. Impedance types and values for the receive dissipative element 622 may be selected as described above for the dissipative element 122. The terminating impedances 646 and 648 may be substantially the same impedance value as the receive coaxial cable and/or each of the respective transmission lines coupling the differential receiver 110 inputs to the receive common-mode choke 618. Typical values may be, but are not limited to, about 50 ohms for each of the terminating impedances 646 and 648, and about 33 ohms for the receive dissipative element 622. DC blocking capacitors 624, 626 and 628 may also be added as shown in FIG. 6. Capacitor 629 may optionally be used to DC block and radio frequency bypass one of the inputs of the differential receiver 110 as shown in FIG. 6. Similarly, capacitor 129 may optionally be used to DC block and radio frequency bypass one node of the isolation choke 118.

Figure 7:
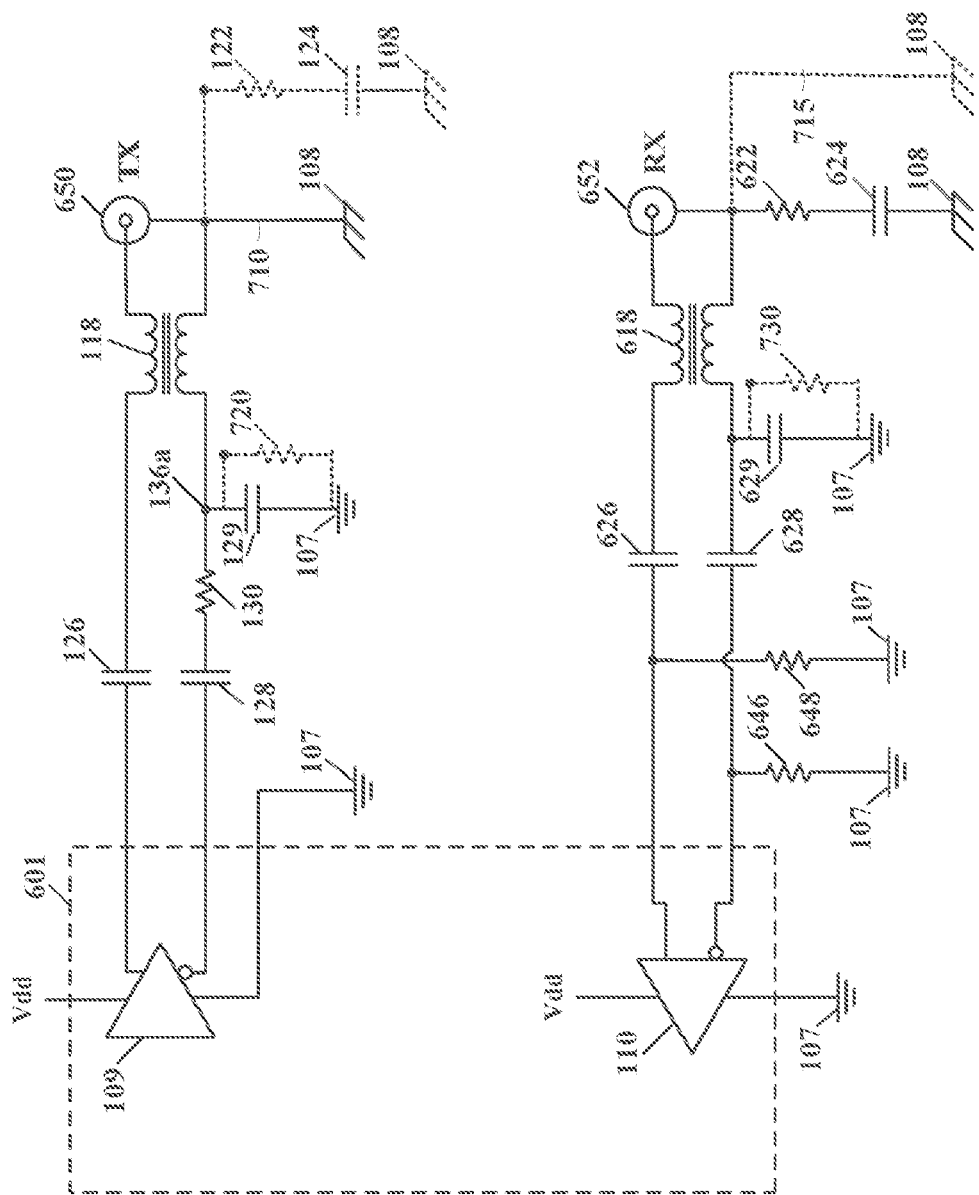
FIG. 7 illustrates a schematic diagram of a second data communications circuit using separate circuit components and coaxial cables for receive and transmit and having reduced EMI, according to another specific embodiment of this disclosure.

Referring to FIG. 7, depicted is a schematic diagram of yet another data communications circuit using separate circuit components and coaxial cables for receive and transmit and associated circuits and having reduced EMI similar to FIG. 6. Again, this embodiment uses separate coaxial cables. However, in one of the TX or the RX circuit, the coaxial shield of the connector may be directly connected to ground not using the dissipative resistor 122/622 of FIG. 6. For example as shown in FIG. 7, according to one embodiment, the shield of connector 650 is directly connected to ground 108 via connection 710 instead of using the dissipative element 122. Otherwise the transmitter is identical to the embodiments of FIGS. 1 and 6. When the shield of the transmitter connector 650 is directly connected with ground the receiver circuit remains unchanged with respect to FIG. 6. In other words, the dissipative elements 622 and DC blocking capacitor 624 couple the shield of connector 652 with chassis ground 108. Otherwise the circuits remain the same with respect to FIG. 6.

As shown in FIG. 7, the transmitter 109 and the receiver 110 may be arranged in a single device 601 thereby forming a transceiver. A respective second communication device coupled through the two coaxial cables would then comprise the same arrangement as shown in FIG. 7. Thus, only one side of a coaxial cable would connect the shield directly with chassis ground.

In an alternative embodiment, as indicated by the dotted lines in FIG. 7, the transmitter circuit remains unchanged with respect to FIG. 6 and the shield of connector 652 in the receiver circuit is directly connected with the chassis ground 108 via connection 715.

According to further embodiments, as shown in FIG. 7, optional resistors 720 and 730 in parallel to capacitances 129 and 629 can be introduced, which improves the time response (recovery time) to specific disturbances.

Referring to FIG. 2, depicted is a schematic block diagram of a prior technology data communications system using coaxial cable. NRZ coding provides for a simplistic and therefore cost effective solution which however results in a broadband excitation. A very low impedance cable shield/chassis ground connection creates a High Q structure with dipole/loop antenna effects that may amplify disturbances (due to real-life parasitic effects).

Referring to FIG. 3, depicted is a schematic block diagram of a data communications system using the coaxial cable circuit shown in FIG. 1. A preferred embodiment of this disclosure adds a dissipative element 122 in the signal loop to lower the circuit Q. This lowers the shielding effectiveness of the coaxial cable 103. This is compensated for, according to the teachings of this disclosure, by using a common mode choke 118 in combination with the CMRR of a differential receiver 110 (FIG. 1). The common mode choke 118 is one stage of counteracting (compensating for) the reduced shielding effectiveness. The other stage is the CMRR of the differential receiver 110. This is two stage approach where every stage addresses different frequency ranges (CMRR covers the low frequency range noise rejection; the common mode choke covers the high frequency noise rejection). In other words the common mode choke compensates for the declining CMRR effectiveness at higher frequencies of the differential receiver 110.

Figure 4:
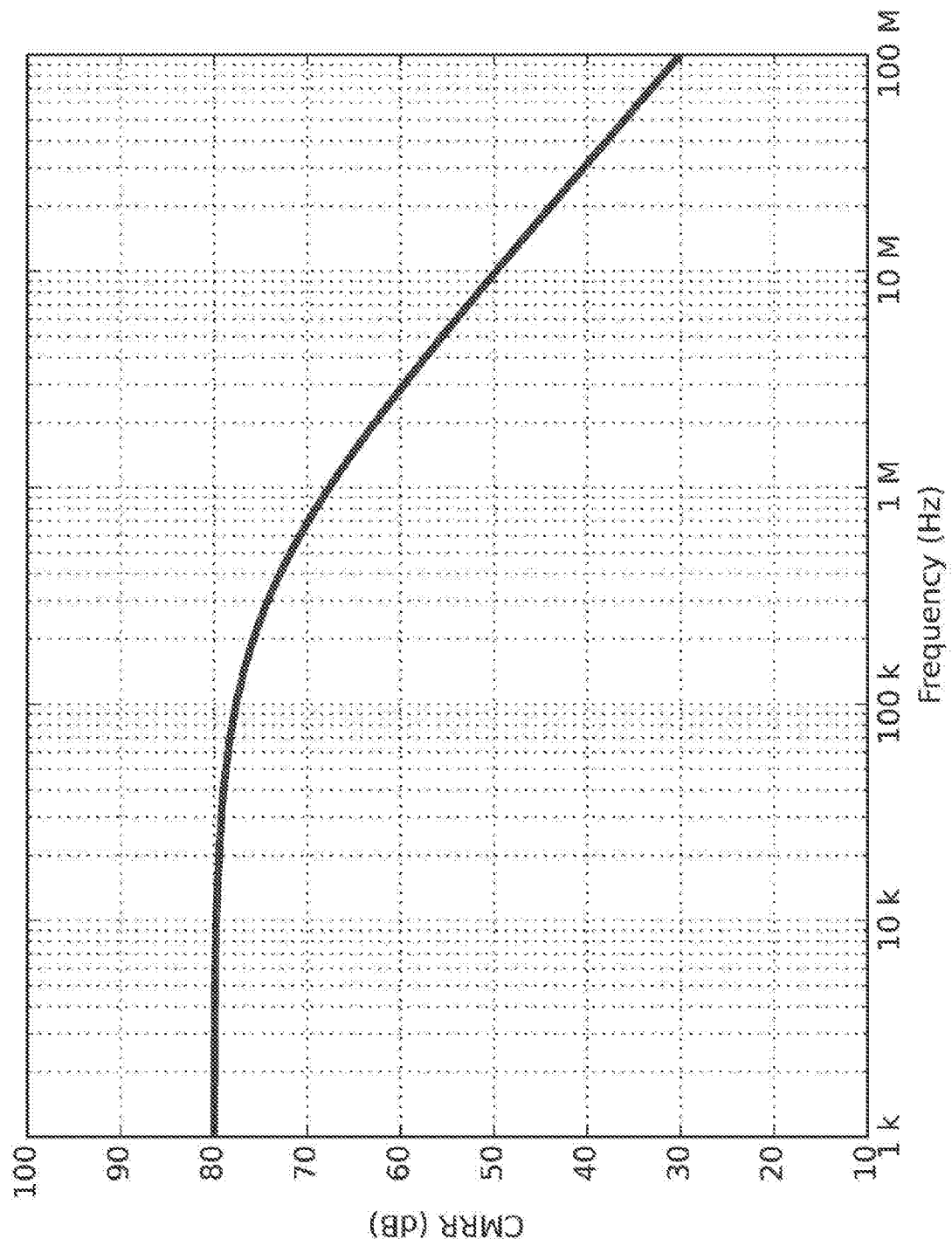
FIG. 4 illustrates an example graph of the CMRR of a differential receiver at lower frequencies, according to the teachings of this disclosure.

Referring to FIG. 4, depicted is an example graph of the CMRR of a differential receiver at lower frequencies, according to the teachings of this disclosure. Differential receivers are able to exhibit high (>80 dB) levels of common-mode rejection to frequencies of several tenths of Hz to several tenths of a MHz. At higher frequencies the level of common-mode rejection declines.

Figure 5:
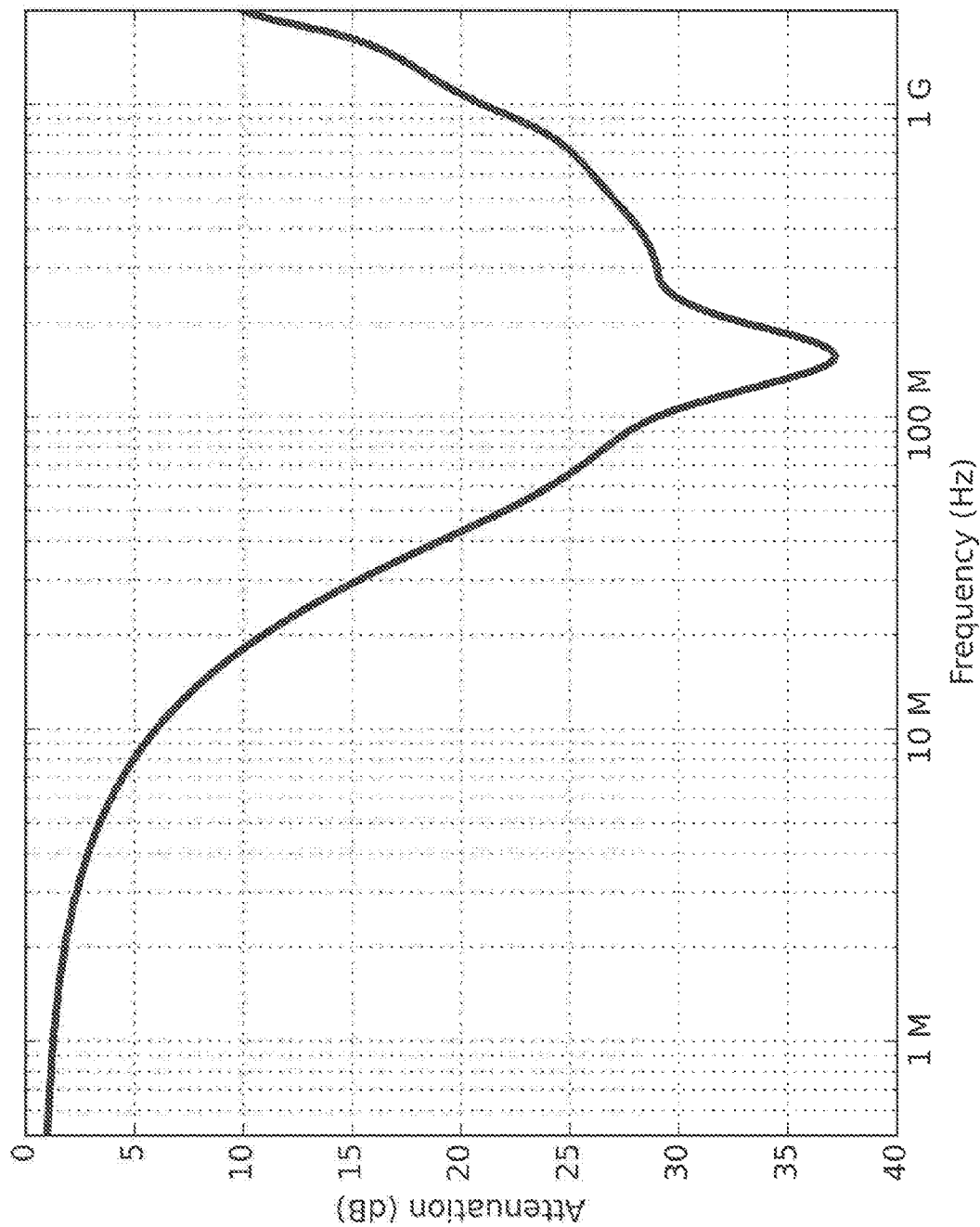
FIG. 5 illustrates an example graph of common mode frequency response of a common mode choke at higher frequencies, according to the teachings of this disclosure.

Shown in FIG. 5 is an example graph of common mode frequency response of a common mode choke at higher frequencies, according to the teachings of this disclosure. The common-mode rejection of a suitable common-mode choke can exhibit high levels of common-mode rejection (>30 dB) in the frequency range above 100 MHz. Common mode attenuation effect to lower frequencies declines and for much higher frequencies (1 GHz and above) is dominated by parasitic (capacitive) coupling effects.

Therefore this multistage combination of a differential receiver and a common mode choke approach provides substantially the same emission/immunity levels as the un-damped high Q coaxial cable by using to advantage the lower frequency common mode rejection of the differential driver/receiver 109 and the higher frequency common mode rejection of the common mode choke 118.

It is contemplated and within the scope of this disclosure that other embodiments may be configured by one skilled in the art of electronics and having the benefit of this disclosure. It is also contemplated and within the scope of this disclosure that embodiments disclosed herein may be successfully applied to similar circuits that may be configured in any transistor technology, including but not limited to, CMOS BICMOS and SiGe BICMOS. Also embodiments disclosed herein may benefit communications signals when implemented as either differential or single ended configurations.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A transmission circuit using two coaxial cables each having a center conductor and a shield, comprising:
    an integrated circuit comprising a differential driver having first and second outputs, and a differential receiver having first and second inputs;
    a first common mode choke coupled between the first output of the differential driver and a center conductor of the coaxial cable, and between the second output of the differential driver and the shield of one of the coaxial cables, wherein the shield is directly connected with a first ground node;
    a first terminating impedance coupled between the second output of the first differential driver and a second ground node;
    a second common mode choke coupled between the first input of the differential receiver and the center conductor of the other coaxial cable, and between the second input of the differential receiver and the shield of the other coaxial cable;
    second terminating impedances coupled between the first and second inputs of the differential receiver and the second ground node; and
    a dissipative element coupled between the shield of the other coaxial cable and the first ground node.

2. The transmission circuit according to claim 1, wherein the first terminating impedance comprises a first resistor and a first capacitance coupled in series, wherein a node between the first and second resistor is coupled with the first common mode choke.

3. The transmission circuit according to claim 2, further comprising a second resistor coupled in parallel with the first capacitance.

4. The transmission circuit according to claim 2, further comprising first and second DC-blocking capacitors coupled between the first and second outputs of the differential driver and the first common mode choke, and
    third and fourth DC-blocking capacitors coupled between the first and second inputs of the differential receiver and the second common mode choke.

5. The transmission circuit according to claim 4, further comprising a second capacitance coupled between the second ground and a node between the fourth DC-blocking capacitor and the second common mode choke.

6. The transmission circuit according to claim 5, further comprising a third resistor coupled in parallel with the second capacitance.

7. The transmission circuit according to claim 1, wherein the second ground node is connected to a digital ground plane.

8. The transmission circuit according to claim 1, wherein the first ground node is connected to a chassis ground.

9. The transmission circuit according to claim 1, wherein the first and the second ground nodes are coupled together.

10. A transmission circuit using two coaxial cables each having a center conductor and a shield, comprising:
an integrated circuit comprising a differential driver having first and second outputs, and a differential receiver having first and second inputs;
a first common mode choke coupled between the first output of the differential driver and a center conductor of the coaxial cable, and between the second output of the differential driver and the shield of one of the coaxial cables;
a first terminating impedance coupled between the second output of the first differential driver and a first ground node;
a dissipative element coupled between the shield of the coaxial cable and a second ground node;
a second common mode choke coupled between the first input of the differential receiver and the center conductor of the other coaxial cable, and between the second input of the differential receiver and the shield of the other coaxial cable, wherein the shield of the other coaxial cable is directly connected with the second ground node;
second terminating impedances coupled between the first and second inputs of the differential receiver and the first ground node.

11. A system for transferring information over a coaxial cable having a center conductor and a shield, said system comprising:
a data transmission device comprising:
a first integrated circuit comprising a differential driver having first and second outputs,
a first common mode choke coupled between the first output of the differential driver and the center conductor, and between a first ground node and the shield of one end of the coaxial cable, respectively;
a first terminating impedance coupled between the second output of the differential driver and the first ground node;
wherein the shield of the one end of the coaxial cable is directly connected with a second ground node; and
a data reception device comprising:
a second integrated circuit comprising a differential receiver having first and second inputs,
a second common mode choke coupled between the first and second inputs of the differential receiver and the center conductor and the shield of another end of the coaxial cable, respectively;
second terminating impedances coupled between each differential input of the differential receiver and a third ground node, and
a second dissipative element coupled between the shield of the another end of the coaxial cable and a fourth ground node.

12. The system according to claim 11, further comprising a radio frequency bypass capacitor coupled between the third ground node and the differential input of the differential receiver not coupled to the center conductor of the coaxial cable through the second common mode choke.

13. The system according to claim 11, further comprising:
a first printed circuit board having a first ground plane thereon, wherein the first integrated circuit is mounted on the first printed circuit board; and
a second printed circuit board having a second ground plane thereon, wherein the second integrated circuit is mounted on the second printed circuit board.

14. The system according to claim 13, further comprising:
first and second transmission lines on the first printed circuit board and coupled between the first and second outputs, respectively, of the differential driver and the first common mode choke; and
third and fourth transmission lines on the second printed circuit board and coupled between the first and second inputs, respectively, of the differential receiver and the second common mode choke.

15. The system according to claim 11, wherein the dissipative element comprises a dissipative resistor.

16. The system according to claim 14, further comprising a DC-blocking capacitors coupled in series with the dissipative resistor and the fourth ground node.

17. The system according to claim 11, further comprising:
third and fourth DC-blocking capacitors coupled between the first and second outputs of the differential driver and the first common mode choke; and
fifth and sixth DC-blocking capacitors coupled between the first and second inputs of the differential receiver and the second common mode choke.

18. A system for transferring information over a coaxial cable having a center conductor and a shield, said system comprising:
a data transmission device comprising:
a first integrated circuit comprising a differential driver having first and second outputs,
a first common mode choke coupled between the first output of the differential driver and the center conductor, and between a first ground node and the shield of one end of the coaxial cable, respectively;
a first terminating impedance coupled between the second output of the differential driver and the first ground node;
a dissipative element coupled between the shield of the one end of the coaxial cable and a second ground node; and
a data reception device comprising:
a second integrated circuit comprising a differential receiver having first and second inputs,
a second common mode choke coupled between the first and second inputs of the differential receiver and the center conductor and the shield of another end of the coaxial cable, respectively;
second terminating impedances coupled between each differential input of the differential receiver and a third ground node, and
wherein the shield of the another end of the coaxial cable is directly coupled with a fourth ground node.

19. The system according to claim 18, further comprising a radio frequency bypass capacitor coupled between the third ground node and the differential input of the differential receiver not coupled to the center conductor of the coaxial cable through the second common mode choke.

20. The system according to claim 18, further comprising:
a first printed circuit board having a first ground plane thereon, wherein the first integrated circuit is mounted on the first printed circuit board; and
a second printed circuit board having a second ground plane thereon, wherein the second integrated circuit is mounted on the second printed circuit board.

21. The system according to claim 20, further comprising:
first and second transmission lines on the first printed circuit board and coupled between the first and second outputs, respectively, of the differential driver and the first common mode choke; and
third and fourth transmission lines on the second printed circuit board and coupled between the first and second inputs, respectively, of the differential receiver and the second common mode choke.

22. The system according to claim 18, wherein the dissipative element comprises a dissipative resistor.

23. The system according to claim 21, further comprising a DC-blocking capacitor coupled in series with the dissipative resistor and the second ground node.

24. The system according to claim 18, further comprising:
third and fourth DC-blocking capacitors coupled between the first and second outputs of the differential driver and the first common mode choke; and
fifth and sixth DC-blocking capacitors coupled between the first and second inputs of the differential receiver and the second common mode choke.

* * * * *